United States Patent [19]

Hinckley, Jr.

[11] 4,075,513
[45] Feb. 21, 1978

[54] AVERAGING AND PEAK DETECTION CIRCUIT

[75] Inventor: William L. Hinckley, Jr., Westminster, Calif.

[73] Assignee: Rockwell International Corporation, El Segundo, Calif.

[21] Appl. No.: 729,226

[22] Filed: Oct. 4, 1976

[51] Int. Cl.² ............................................. H03K 5/20
[52] U.S. Cl. .................................. 307/350; 307/261; 307/351; 324/103 P; 328/151
[58] Field of Search ............... 307/350, 351, 352, 353, 307/261; 324/103 P, 115; 328/151

[56] References Cited

U.S. PATENT DOCUMENTS

| 3,428,829 | 2/1969 | Haynie et al. | 307/352 |
| 3,638,183 | 1/1972 | Progler et al. | 307/353 X |
| 3,949,294 | 4/1976 | Imura | 324/115 X |

Primary Examiner—John Zazworsky
Attorney, Agent, or Firm—H. Fredrick Hamann; G. Donald Weber, Jr.; Morland C. Fischer

[57] ABSTRACT

A receive line signal detector circuit having slow and fast charging modes of operation to receive both relatively long or short coded information messages. The circuit includes a transistor means to switch the circuit into either of a first slow charging, averaging mode or a second fast charging, peak detection mode of operation depending upon the presence and duration of a sequence of input information signals. The circuit, however, is slow discharging in both the averaging and peak detection modes.

9 Claims, 2 Drawing Figures

AVERAGING AND PEAK DETECTION CIRCUIT

BACKGROUND OF THE INVENTION

Frequently, coded information messages relating to the condition of memory means, measuring devices, and the like are transmitted by a line signal (e.g. via a telephone line) in one of two forms. When sequential point-to-point communication is conducted, a relatively long information signal sequence is transmitted. However, when a multi-point communication is conducted, generally a shorter information signal sequence is transmitted. The information sequence of the message is usually preceded by a preamble which is indicative of the presence of the forthcoming information sequence. A receive line signal detector first senses the preamble portion of the coded message to determine if it is above a given threshold level so as to be able to discriminate between the presence of information signals and noise. The receive line signal detector must be responsive to both long and short information sequences. When the amplitude of the coded message drops below a lower level for a particular interval of time, the information sequence is assumed to be completed. After this particular time interval, the receive line signal detector indicates that the information sequence is absent.

This invention relates to a unique, compact, power saving averaging and peak detection circuit to function in either of a relatively slow charging, signal averaging mode or a relatively fast charging, signal peak detection mode of operation so as to be responsive to both long and short information messages, while having a relatively slow discharge time in either mode.

Examples of prior art circuits are included in the following patents:
U.S. Pat. No. 3,307,048 Feb. 28, 1967
U.S. Pat. No. 3,469,111 Sept. 23, 1969
U.S. Pat. No. 3,596,109 July 27, 1971

SUMMARY OF THE INVENTION

Briefly, and in general terms, an averaging and peak detection circuit is disclosed having slow and fast charging modes of operation to detect the presence of relatively long or short coded information sequences. The circuit includes terminals to receive a time varying, rectified d.c. input signal, suitable resistance means, a transistor to switch the circuit into either the first or second mode of operation, and a charge storing capacitor. During a first, averaging mode of operation, a first control signal is applied to render the transistor nonconducting. A current path is formed with the charge storing capacitor comprising an R-C circuit. After a relatively long charging time, sufficient voltage is stored on the capacitor, which voltage corresponds to the ON threshold level of a high impedance output detector connected across the storage capacitor.

During a second, peak detection mode of operation, a second control signal is applied to render the transistor conducting. The transistor, in the second mode of operation, functions as a switch, and the conduction path thereof forms a principle current path to charge the storage capacitor. However, when the base voltage of the transistor periodically drops below the emitter voltage thereof, the transistor is rendered substantially nonconducting. Hence, the transistor, in the second mode of operation, also functions to prevent appreciable charge from leaking off the capacitor and back through the conduction path of the transistor. Thus, after a relatively short charging time, sufficient voltage is stored on the capacitor, which voltage corresponds to the ON threshold level of the output detector. When the amplitude of the input signal drops to the zero reference level, the only discharge path for the capacitor is through a resistor, which provides for a relatively long (i.e. slow) discharge time in both modes of operation.

DESCRIPTION OF THE PREFERRED EMBODIMENT

Figure 1:
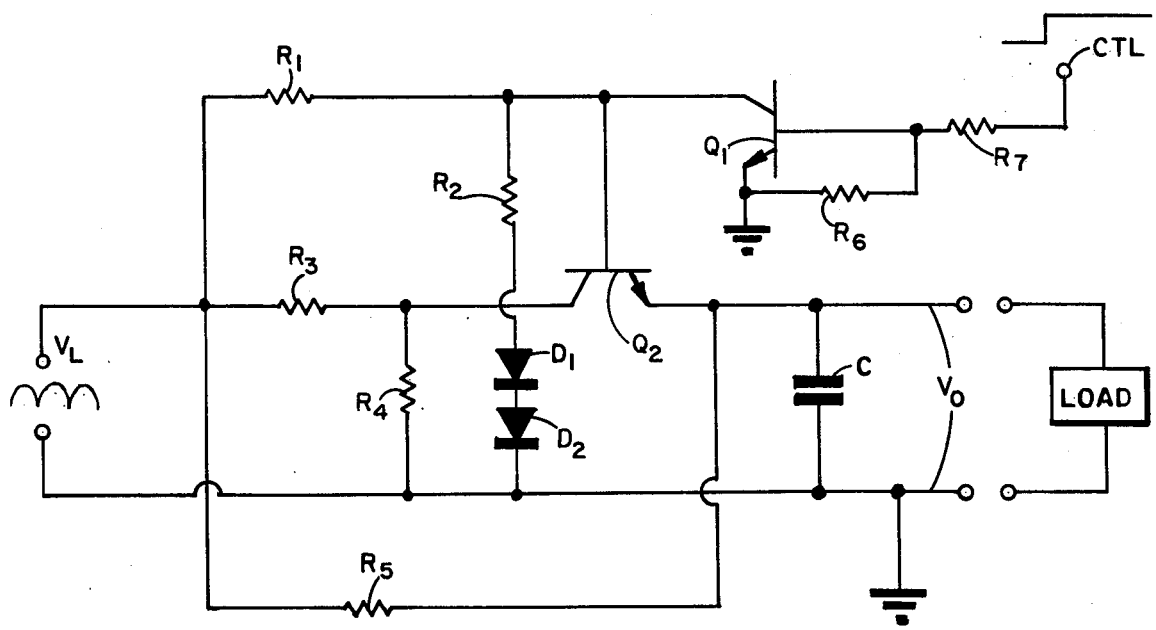
FIG. 1 shows a preferred implementation of the two mode, averaging and peak detection circuit of the instant invention.

FIG. 1 of the drawings shows a preferred embodiment for implementing the slow or fast charging, averaging and peak detection circuit of the present invention. Typically, a coded information line signal (such as, for example, that carried via a telephone line) has an a.c. level. Therefore, a full wave rectifier (not shown) is generally used to convert the line signal to a d.c. level. The rectified line signal may then be supplied to a limiter (also not shown), to limit the amplitude of the coded signal. A time varying, d.c. output signal, $V_L$, from the limiter is applied across the input terminals of the averaging and peak detection circuit. In general terms, the disclosed averaging and peak detection circuit smooths the signal $V_L$ so as to delay the buildup and decay thereof for meeting specified turn-on and turn-off times of the circuit threshold detector.

The circuit includes suitable resistor elements $R_1$ - $R_7$. Resistor $R_1$ forms a voltage divider network with resistor $R_2$, and resistor $R_3$ forms a voltage divider network with resistor $R_4$. For the purpose of obtaining output d.c. waveforms, the maximum amplitudes of which are substantially equivalent in both the averaging and peak detection modes of operation, the resistance ratio of $R_1/R_2 = R_3/R_4$. In a preferred embodiment, this resistance ratio is approximately equal to 1.

The conduction path of a first NPN transistor $Q_1$ is selectively connected between resistor $R_1$ and a source of reference potential, such as ground. A resistor $R_6$ is connected between the emitter and base terminals of transistor $Q_1$. The base terminal of transistor $Q_1$ is connected to a control terminal CTL via resistor $R_7$. The logic level of a signal applied to the control terminal CTL may be pre-programmed according to the length of the forthcoming information message and can originate from a suitable controller, such as a computer. The control signal applied to terminal CTL controls the conductivity of transistor $Q_1$.

The collector terminal of transistor $Q_1$ is connected to the base terminal of a second NPN transistor $Q_2$. The conductivity of transistor $Q_2$ is subsequently controlled by transistor $Q_1$. The conduction path of transistor $Q_2$ is selectively connected between one plate of a charge storing capacitor C and an electrical junction formed by one end of resistors $R_3$ and $R_4$. The second plate of charge storing capacitor C is connected to the other end of resistor $R_4$ and to the (negative) input terminal, so that capacitor C is connected in electrical parallel across resistor $R_4$ when transistor $Q_2$ is conducting. A suitable and conventional high impedance load, such as, for example, a source follower amplifier or a d.c. threshold detector, is connected across capacitor C and is responsive to the signal thereat. The detector, which also provides an indication of the average and peak amplitude of signal $V_L$ (as will be explained in greater detail hereinafter), senses when the input signal $V_L$ is above a given level (ON threshold) or below a lower level (OFF threshold). Resistor $R_5$ is connected in electrical parallel across the series connection of resistor $R_3$ and the conduction path of transistor $Q_2$. Resistance $R_5$ is selected to be many times (e.g. ten) that of resistors $R_1 - R_4$ in order to limit the current therethrough. Diodes $D_1$ and $D_2$ are connected in electrical series with resistor $R_2$.

Figure 2:
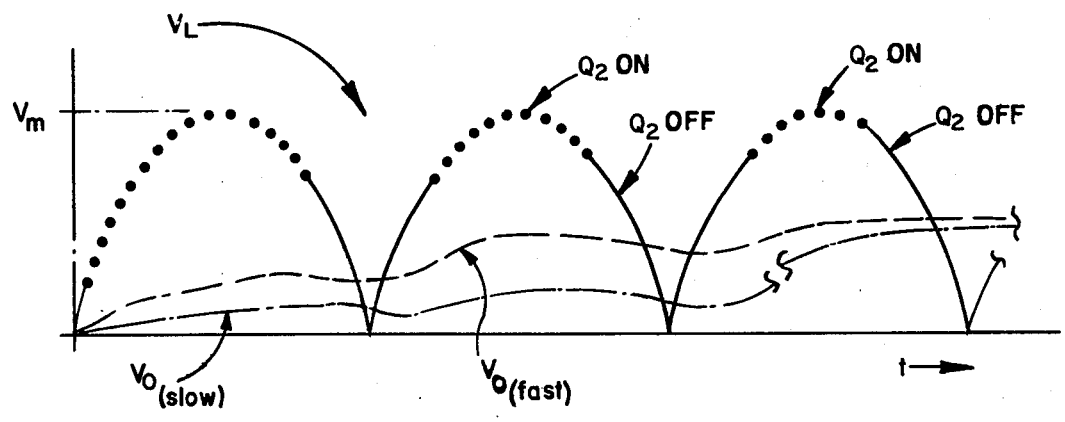
FIG. 2 illustrates the waveforms representative of the input signal and the respective output signals during each of the first and second modes of operation for the circuit of FIG. 1.

Referring concurrently to FIGS. 1 and 2, the operation of the slow or fast charging, averaging and peak detection circuit is described as follows. During a first, averaging, mode of operation, when a relatively long message sequence is to be received at the circuit input terminals, a relatively HI (e.g. positive) signal is applied to control terminal CTL. As a result, transistor $Q_1$ is rendered conductive, and the base terminal of transistor $Q_2$ is clamped to ground via the conduction path of transistor $Q_1$. Therefore, transistor $Q_2$ is rendered non-conductive during the first, averaging, mode of operation. Thus, in the averaging mode of operation, a current path is formed including resistor $R_5$ and capacitor C. As will be recognized by those skilled in the art, during the first, averaging mode of operation, this current path comprises a conventional R-C, low pass network, wherein the rise time of capacitor C is dependent upon the time constant (R-C) of the network. The waveform representing the d.c. output signal $V_{o(slow)}$ during the averaging mode of operation is illustrated in FIG. 2. The charge stored by capacitor C is slowly increased with each succeeding cycle of the input signal $V_L$, inasmuch as a portion of the stored charge is leaked from capacitor C back through resistor $R_5$ as the amplitude of the $V_L$ signal periodically decreases. After a relatively long charging time, sufficient voltage is ultimately stored on capacitor C, which voltage corresponds to the ON threshold level of the high impedance detector.

During the second, peak detection, mode of operation, when a relatively short message sequence is to be received at the circuit input terminals, a relatively LOW (e.g. ground) signal is applied to control terminal CTL. As a result, transistor $Q_1$ is rendered non-conductive, and the base electrode of transistor $Q_2$ is no longer clamped to ground during the second mode of operation. Hence, input signal $V_L$ is applied to the base terminal of transistor $Q_2$ via resistor $R_1$, and transistor $Q_2$ is rendered conductive. Therefore, storage capacitor C is primarily charged via the conduction path of transistor $Q_2$ during the second, peak detection, mode by the current paths comprising resistors $R_1$ (base current) and $R_3$ (collector current). By selecting resistances $R_1 = R_3$ and $R_2 = R_4$, transistor $Q_2$ is turned on hard (i.e. the inherent impedance across the conduction path terminals thereof is substantially minimized). Hence, transistor $Q_2$ functions as a switch to pass the input signal $V_L$ to the charge storing capacitor C during the second peak detection mode of operation.

However, transistor $Q_2$ also functions as a semi-unidirectional current conducting means in the peak detection mode of operation so as to prevent capacitor C from appreciably discharging (e.g. by no more than a few hundred millivolts) back through resistor $R_3$. This enables the presently described circuit to operate in the peak detection mode. When the amplitude of the input signal $V_L$ decreases, the base voltage of transistor $Q_2$ eventually drops below the emitter voltage thereof tending to turn off transistor $Q_2$. However, since the base voltage of transistor $Q_2$ remains higher than the collector voltage, the base-collector junction is forward biased and the collector operates as an emitter. Transistor $Q_2$ thus functions in a reverse $\beta$ mode so that capacitor C begins to discharge. The current gain, $\beta$, of transistor $Q_2$ is much less in the reverse $\beta$ mode than in the normal mode. This has the effect of further lowering the base voltage of transistor $Q_2$. The discharge current from capacitor C back through $Q_2$ raises the collector voltage thereof. The increased base current back through resistor $R_1$ and the discharge current through $Q_2$ act to reduce the forward bias on the base-collector junction of $Q_2$, thereby increasing the impedance of $Q_2$. Therefore, transistor $Q_2$ is eventually rendered non-conducting, as the amplitude of the input signal $V_L$ continues to decrease toward the zero reference level. The time during which transistor $Q_2$ is rendered conductive is illustrated in FIG. 2 and represented along the $V_L$ waveforms (shown dotted). However, shortly after the amplitude of the $V_L$ waveform begins to decrease and until the $V_L$ signal achieves the corresponding amplitude for the next cycle, transistor $Q_2$ is rendered non-conductive. As shown in FIG. 2, transistor $Q_2$ conducts for shorter intervals of time during each succeeding cycle of input signal $V_L$. Subsequently, transistor $Q_2$ will be rendered conducting only near the peak amplitude, $V_m$, of the $V_L$ waveform. During that time when transistor $Q_2$ functions as a semi-unidirectional current conducting means, deterioration of the signal stored by capacitor C is substantially minimized, and the present circuit is sensitive to the amplitude peaks of input signal $V_L$, in the second, peak detection, mode of operation, rather than to the average value of $V_L$, as accomplished in the first, averaging mode of operation. Capacitor C is rapidly charged by virtue of the dual nature of transistor $Q_2$ (i.e. as a switch or as a semiunidirectional current conducting means) after a relatively few cycles of signal $V_L$. Moreover, the resistances of $R_1$-$R_4$ may be selected to be substantially less than that of $R_5$ to provide storage capacitor C with still a faster charging time in the peak detection mode than in the averaging mode of operation. The waveform representing the d.c. output signal $V_{o(fast)}$ during the second, peak detection, mode of operation is also illustrated in FIG. 2. Hence, after a relatively short charging time, a sufficient voltage is stored on capacitor C, which voltage corresponds to the ON threshold level of the high impedance detector.

The voltage divider network formed by resistors $R_3$ and $R_4$ attenuates input signal $V_L$ in the second, peak detection, mode of operation so that for any input signal, the maximum amplitude of the output signal $V_o$ is substantially the same in either of the averaging or peak detection modes. If the resistances of $R_1$, $R_2$, $R_3$ and $R_4$ are selected as equal to one another, transistor $Q_2$ is driven into saturation during the peak detection mode, and the operation of the circuit is made relatively independent of the $\beta$ of transistor $Q_2$. Series connected diodes $D_1$ and $D_2$ provide suitable compensation for the base to emitter voltage of transistor $Q_2$. The diode compensation permits transistor $Q_2$ to be at or near saturation from the level at which it is initially rendered conductive to the peak value, $V_m$, of the input signal $V_L$. As previously disclosed, the threshold detector turn-on time (i.e. the capacitor charging time required to achieve the ON threshold level) is faster in the peak detection mode than in the averaging mode. However, the detector turn-off time is substantially the same in both the averaging and peak detection modes. When the input signal $V_L$ goes to zero amplitude in the peak detection mode, the base-to-emitter junction of transistor $Q_2$ is reverse biased, thereby rendering transistor $Q_2$ non-conductive, as in the averaging mode.

It will be apparent that while a preferred embodiment of the invention has been shown and described, various modifications and changes can be made without departing from the true spirit and scope of the invention. For example, transistors $Q_1$ and $Q_2$ may be any suitable multi-terminal semiconductor device, and resistors $R_1$ - $R_7$ may be chosen to have the respective resistances which enable the presently disclosed receive line signal detector circuit to suitably function in both the slow and fast modes of operation.

Having thus set forth a preferred embodiment of the instant invention, what is claimed is:

1. In combination:
   charge storing capacitance means;
   input terminal means to receive an input signal;
   output terminal means connected to said charge storing capacitance means and responsive to the charge stored thereon;
   impedance means connected between said input terminal means and said charge storing capacitance means; and
   a first multi-terminal semiconductor device having first and second conduction path electrodes connected between said input terminal means and said charge storing capacitance means;
   said multi-terminal device having a control electrode for receiving a first driving signal from a source of reference potential to disable said device, whereby said capacitance means is charged by the input signal via said impedance means, some of the charge stored by said capacitance means periodically leaking therefrom so that said capacitance means is charged up in a relatively long interval of time; or
   the control electrode of said multi-terminal device receiving a second driving signal from said input terminal means to enable said device, whereby said capacitance means is charged by the input signal via the conduction path of said device, said device adapted to be periodically rendered non-conductive as a function of said input signal so as to thereby substantially reduce the leakage of charge from said capacitance means so that said capacitance means is charged up in a relatively short interval of time.

2. The combination recited in claim 1 wherein said impedance means is connected in electrical parallel with the conduction path of said first multi-terminal semiconductor device.

3. The combination recited in claim 1, including a second multi-terminal semiconductor device having first and second conduction path electrodes and a control electrode;
   said conduction path electrodes connected between the control electrode of said first multi-terminal device and said source of reference potential for providing said first driving signal to control the conductivity of said first device; and
   said control electrode of said second device connected to terminal means to receive a control signal to control the conductivity of said second device.

4. The combination recited in claim 1, including unidirectional current conducting means connected between the control electrode of said first multi-terminal device and said input terminal means.

5. The combination recited in claim 1, including first, second, third and fourth resistance means,
   said first resistance means connected between said input terminal means and the control electrode of said first multi-terminal device,
   said second resistance means connected between said first resistance means and said input terminal means, and
   said third and fourth resistance means interconnected between said input and output terminal means to attenuate said input signal,
   said fourth resistance means connected in electrical parallel with said charge storing capacitance means when said first multi-terminal device is enabled.

6. The combination recited in claim 5, wherein the resistances of said first, second, third and fourth resistance means are chosen according to the relationship:

$$R_1/R_2 = R_3/R_4.$$

7. The combination recited in claim 6, wherein said relationship of the resistance ratios between the first, second, third and fourth resistance means is approximately unity.

8. A signal averaging and peak detection circuit comprising:
   input terminal means to receive a time varying input signal;
   source means to provide a reference potential signal;
   charge storing capacitor means;
   load means connected to said charge storing capacitor means and responsive to the signal thereat for providing an indication of the average or peak amplitude of said time varying input signal;
   resistance means connected between said input terminal means and said charge storing capacitance means; and
   a first multi-terminal semiconductor device having a conduction path connected between said input terminal means and said charge storing capacitor means, said multi-terminal device adapted to switch said circuit into either of an averaging or peak detection mode of operation;
   said first multi-terminal semiconductor device having a control electrode connected to receive first and second control signals;
   said control electrode receiving a first control signal from said reference potential source means to disable said multi-terminal device, whereby said resistance means forms a current path for charging said capacitor means in said averaging mode of operation;
   said control electrode receiving a second control signal from said input terminal means to enable said multi-terminal device, whereby the conduction path thereof forms a current path for charging said capacitor means in said peak detection mode of operation.

9. The averaging and peak detection circuit recited in claim 8, including a second multi-terminal semiconductor device having conduction path electrodes and a control electrode;

said conduction path electrodes selectively connected between the control electrode of said first multi-terminal semiconductor device and said source of reference potential to enable the application of one of said first and second control signals to said first multi-terminal device control electrode to thereby control the conductivity of said first device.

* * * * *